US009791112B2

(12) United States Patent
Del Castillo et al.

(10) Patent No.: US 9,791,112 B2
(45) Date of Patent: Oct. 17, 2017

(54) SERIAL AND PARALLEL LED CONFIGURATIONS FOR LINEAR LIGHTING MODULES

(71) Applicant: Bridgelux, Inc., Livermore, CA (US)

(72) Inventors: Jesus Del Castillo, Palo Alto, CA (US); Vladimir Odnoblyudov, Danville, CA (US)

(73) Assignee: Bridgelux, Inc., Fremont, CA (US)

(*) Notice: Subject to any disclaimer, the term of this patent is extended or adjusted under 35 U.S.C. 154(b) by 320 days.

(21) Appl. No.: 14/582,194

(22) Filed: Dec. 24, 2014

(65) Prior Publication Data

US 2016/0186940 A1    Jun. 30, 2016

(51) Int. Cl.
| | | |
|---|---|---|
| F21S 4/00 | (2016.01) | |
| F21V 21/00 | (2006.01) | |
| F21K 9/278 | (2016.01) | |
| F21Y 103/10 | (2016.01) | |
| F21Y 115/10 | (2016.01) | |
| H05K 1/18 | (2006.01) | |

(52) U.S. Cl.
CPC .......... *F21K 9/278* (2016.08); *F21Y 2103/10* (2016.08); *F21Y 2115/10* (2016.08); *H05K 1/189* (2013.01); *H05K 2201/10106* (2013.01)

(58) Field of Classification Search
CPC ............... F21K 9/278; F21Y 2103/10; H05K 2201/10106; H05K 2201/09245; H05K 2201/097; H05K 2201/09763; H05K 2201/09254; H05K 2201/09236; H05K 2201/09672; H05K 2201/093

USPC ...................... 362/249.06, 249.02
See application file for complete search history.

(56) References Cited

U.S. PATENT DOCUMENTS

| | | | |
|---|---|---|---|
| 6,739,734 B1 | 5/2004 | Hulgan | 362/243 |
| 6,840,655 B2 | 1/2005 | Shen | 362/249 |
| 7,053,557 B2 | 5/2006 | Cross et al. | 315/74 |
| 7,114,834 B2 | 10/2006 | Rivas et al. | 362/373 |
| 7,476,004 B2 | 1/2009 | Chan | 362/240 |
| 8,072,152 B2 | 12/2011 | Neuman et al. | 315/185 |
| 8,115,393 B2 | 2/2012 | Neal et al. | 315/36 |
| 8,198,109 B2 | 6/2012 | Lerman et al. | 438/28 |
| 8,680,785 B2 | 3/2014 | Kerstens et al. | 315/297 |
| 8,740,410 B2 | 6/2014 | Peifer et al. | 362/249.02 |
| 8,789,966 B2 | 7/2014 | McCanless et al. | 362/218 |
| 8,896,208 B2 | 11/2014 | Shew | 315/88 |

(Continued)

*Primary Examiner* — Peggy Neils
*Assistant Examiner* — William N Harris
(74) *Attorney, Agent, or Firm* — Imperium Patent Works; Darien K. Wallace

(57) ABSTRACT

A linear lighting module includes a first string of series-connected LED dies and a second string of series-connected LED dies. The first string of LED dies is coupled in parallel with the second string of LED dies. All of the LED dies of the first and second strings are aligned with respect to one another. The LED dies of the first string and the second string form a combined string of interleaved LED dies such that an LED die of the second string is disposed between every successive pair of LED dies of the first string. The LED dies of the combined string are mounted on a flexible substrate. Each LED die of the combined string is electrically connected to two conductors. Except for the two end LED dies of the combined string, each successive LED die must be accessed by both conductors from alternating sides of the combined string.

15 Claims, 7 Drawing Sheets

(8 STRINGS OF 5 LEDs)

(56) References Cited

U.S. PATENT DOCUMENTS

| | | | |
|---|---|---|---|
| 8,905,579 B2* | 12/2014 | Dobbins | F21K 9/00 |
| | | | 362/249.02 |
| 9,557,020 B2* | 1/2017 | Hata | H05K 1/0278 |
| 9,587,808 B2* | 3/2017 | Speer | F21K 9/90 |
| 9,590,152 B2* | 3/2017 | Yamada | F21S 4/22 |
| 9,615,417 B2* | 4/2017 | Gramlich, Jr. | H05B 33/0821 |
| 9,635,759 B2* | 4/2017 | Venk | H05K 1/111 |
| 9,638,401 B2* | 5/2017 | Li | F21V 21/005 |
| 9,674,938 B2* | 6/2017 | Palaniswamy | H01L 33/486 |
| 2003/0060062 A1* | 3/2003 | Honda | H05K 1/111 |
| | | | 439/67 |
| 2009/0316409 A1* | 12/2009 | Kim | H05K 1/0295 |
| | | | 362/249.14 |
| 2010/0284187 A1* | 11/2010 | Layer | F21K 9/00 |
| | | | 362/249.01 |
| 2011/0310590 A1* | 12/2011 | Yamashita | G02F 1/133609 |
| | | | 362/97.1 |
| 2014/0034973 A1* | 2/2014 | Oka | H01L 33/64 |
| | | | 257/88 |
| 2015/0285474 A1* | 10/2015 | Martin | H01L 25/0753 |
| | | | 362/249.02 |
| 2015/0316215 A1* | 11/2015 | Togawa | H01L 25/0753 |
| | | | 362/231 |

* cited by examiner

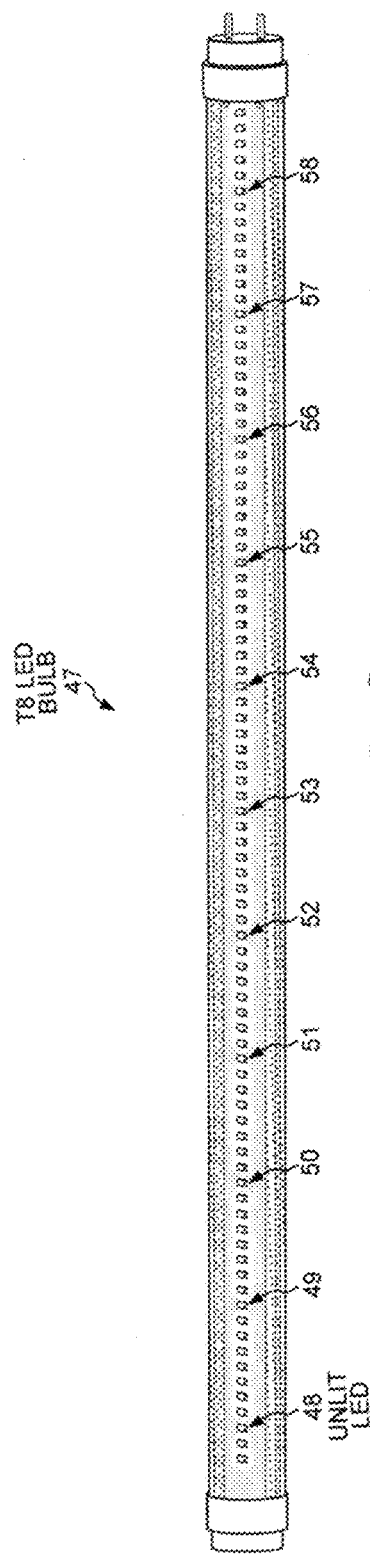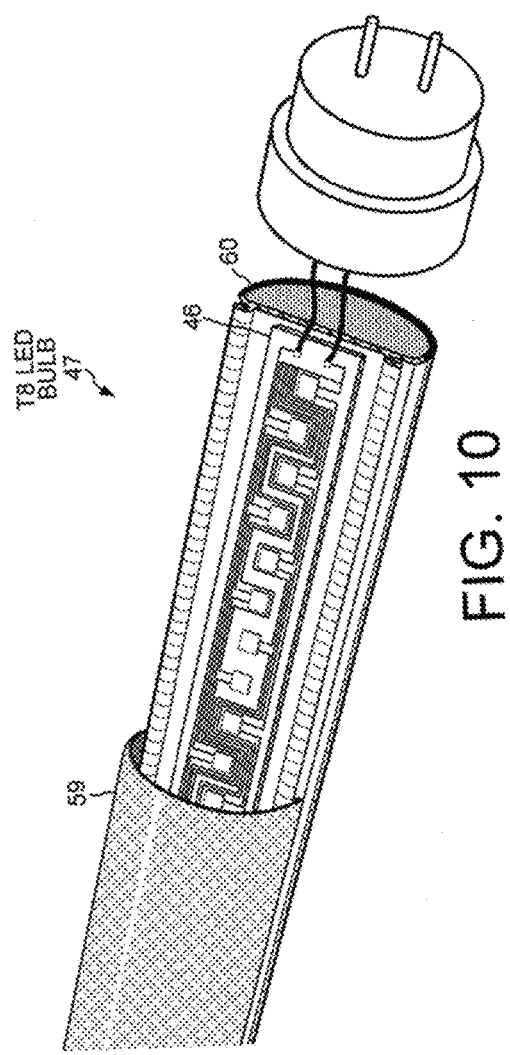

SERIAL AND PARALLEL LED CONFIGURATIONS FOR LINEAR LIGHTING MODULES

TECHNICAL FIELD

The present invention relates generally to packaging for light-emitting diodes, and more particularly to configurations for connecting LEDs in series and in parallel in linear lighting modules such as tubes.

BACKGROUND INFORMATION

For many years, fluorescent lamps were the most common type of light fixture used in commercial lighting applications. These traditional lighting fixtures use fluorescent bulbs in recessed troffers with parabolic reflectors. The most common fluorescent bulbs are the linear T5 (⅝ inch diameter), T8 (1 inch diameter), and T12 (1½ inch diameter) bulbs. However, light emitting diodes (LEDs) can more efficiently convert electrical energy into light than can fluorescent bulbs. Thus, efforts have been made to incorporate LEDs into tubes having the form factor of T5, T8 and T12 fluorescent bulbs. LEDs can then be used to retrofit traditional fluorescent light fixtures by installing LED bulbs in the troffers that were originally designed for fluorescent bulbs. The existing fluorescent lamp ballasts must then be replaced with new power supply drivers for the LEDs.

The LED bulbs are typically configured as strings of series-connected LEDs coupled in parallel. Multiple LEDs are connected in series to form individual LED strings, and then the LED strings are coupled in parallel to a common voltage and current source. The buck converter of the LED driver can operate at a higher efficiency if the wall voltage powering the LED bulb is a multiple of the driver's output voltage. Thus, a popular LED driver in North America converts a 120-volt wall voltage into an output voltage of thirty or forty volts. The band gap of gallium-nitride LEDs commonly used for lighting is about 3.3 volts. So to correspond to the output voltage of a popular LED drive, the voltage drop across a string of series-connected LEDs can be set at about thirty volts by connecting nine LEDs in the string. A buck converter can then efficiently convert the 120-volt wall voltage to the thirty volts required to light the string of nine LEDs.

FIG. 1 (prior art) shows an LED bulb 10 formed by mounting seventy-two packaged LEDs onto a long substrate anchored in a tube 11 that resembles a T8 bulb. The transparent curved cover is not shown in FIG. 1. The LEDs have been connected as eight series-connected strings of nine LEDs each. The eight strings are connected in parallel to power and ground. An LED driver housed below the long substrate converts the 120-volt wall voltage to the thirty volts required to light each of the eight strings of nine LEDs. In the LED bulb 10 shown in FIG. 1, an entire series-connected string of LEDs is not lit. The third string from the left is not lit because one of the LEDs in the string is defective or because a solder connection in the string shorted out. If the circuit is broken at any location along a series-connected string, the entire string goes dark. As LED bulbs are made with larger numbers of LEDs, the probability that a soldering or LED defect will occur rises much faster than merely the proportional increase in the number of LEDs.

Consumers tend to notice a dark portion of an LED bulb caused by a shorted string of LEDs. Even if the amount of light generated by the LED bulb with the dark portion is nearly as bright as the light produced by a bulb with all of the LEDs lit, the consumer will still perceive the dark portion as a defect and is likely to return the LED bulb. Thus, manufacturers of LED bulbs are faced with higher percentages of returned LED bulbs as bulbs with larger numbers of LEDs are being sold.

A method is sought for packaging LED dies in tubes resembling fluorescent bulbs so that inevitable LED and electrical connection defects will not result in a return rate that rises faster than the increase in the number of LEDs in the LED bulbs.

SUMMARY

A linear lighting module includes a first string of series-connected LED dies and a second string of series-connected LED dies. The first string of LED dies is coupled in parallel with the second string of LED dies. All of the LED dies of the first string and the second string are aligned with respect to one another. In one embodiment, the strings of LED dies are arranged in straight lines, whereas in other embodiments, the strings of LED dies are aligned in a curved line. The LED dies of the first string and the second string form a combined string of interleaved LED dies such that an LED die of the second string is disposed between every successive pair of LED dies of the first string. The LED dies of the combined string are mounted on a flexible substrate and are disposed in a tube. Each LED die of the combined string is electrically connected to two conductors. Except for the two end LED dies of the combined string, each successive LED die must be accessed by both conductors from alternating sides of the combined string.

In one embodiment, the LED dies of the combined string are mounted onto a flexible substrate with a single metal layer. The LED dies of the first string are electrically connected to one another by a first group of interconnect tracks formed in the metal layer. The LED dies of the second string are electrically connected to one another by a second group of interconnect tracks such that none of the first group of interconnect tracks crosses any of the second group of interconnect tracks. Thus, no two of the interconnect tracks are stacked over one another and separated by an insulator. In one embodiment, more room is made available between the LED dies on the substrate by using chip scale packaged LED dies whose sides are not longer than 1.8 mm.

In another embodiment, a strip of flexible printed circuit board with pre-mounted and wired LED dies is produced in rolls. The strip of LEDs has a first linear array of LED dies connected in series and a second linear array of LED dies also connected in series. The first linear array of LED dies is coupled in parallel with the second linear array of LED dies. The first linear array of LED dies and the second linear array of LED dies are collinear in that all of the LED dies are arranged in one line. However, the LED dies are not necessary arranged in a straight line such as when the strip of LEDs is rolled. The LED dies of the first linear array are interleaved between the LED dies of the second linear array such that no two LED dies of the first linear array are immediately adjacent to one another without an intervening LED die of the second linear array. Each LED die of the combined string of interleaved LED dies is electrically connected to two conductors. Except for the end LED dies of the combined string, each successive LED die is accessed by both conductors from alternating sides of the combined string. A segment of a roll of the flexible strip of pre-mounted and wired LED dies is inserted into a tube and used to make an LED bulb.

A method of making an LED bulb that has series-connected strings of interleaved LED dies wired using a non-crossing wiring arrangement involves connecting the strings in series and in parallel. The LED dies are connected by interconnect tracks formed in a metal layer of a flexible PCB such that none of the interconnect tracks crosses any other of the interconnect tracks. The LED dies can be mounted to the PCB after the interconnect tracks are formed. A first string of LED dies is electrically connected in series, and a second string of LED dies is electrically connected in series. The first string of LED dies is coupled in parallel with the second string of LED dies such that the first string of LED dies is aligned with the second string of LED dies. The LED dies of the first string are interleaved with the LED dies of the second string such that an LED die of the second string is disposed between every successive pair of LED dies of the first string. Coupling the first string with the second string forms a combined string of aligned LED dies. Each LED die of the combined string is connected to a power supply conductor. Except for the end LED dies of the combined string, the power supply conductor to each successive LED die is connected from an alternating side of the combined string.

Further details and embodiments and techniques are described in the detailed description below. This summary does not purport to define the invention. The invention is defined by the claims.

BRIEF DESCRIPTION OF THE DRAWINGS

The accompanying drawings, where like numerals indicate like components, illustrate embodiments of the invention.

FIG. 9 shows an LED bulb with series-connected strings of LED dies interleaved according to the connection configuration of FIG. 2 and wired using the non-crossing wiring arrangement of FIG. 5.

FIG. 10 shows an end of the LED bulb of FIG. 9 in more detail.

DETAILED DESCRIPTION

Reference will now be made in detail to some embodiments of the invention, examples of which are illustrated in the accompanying drawings.

Figure 1:
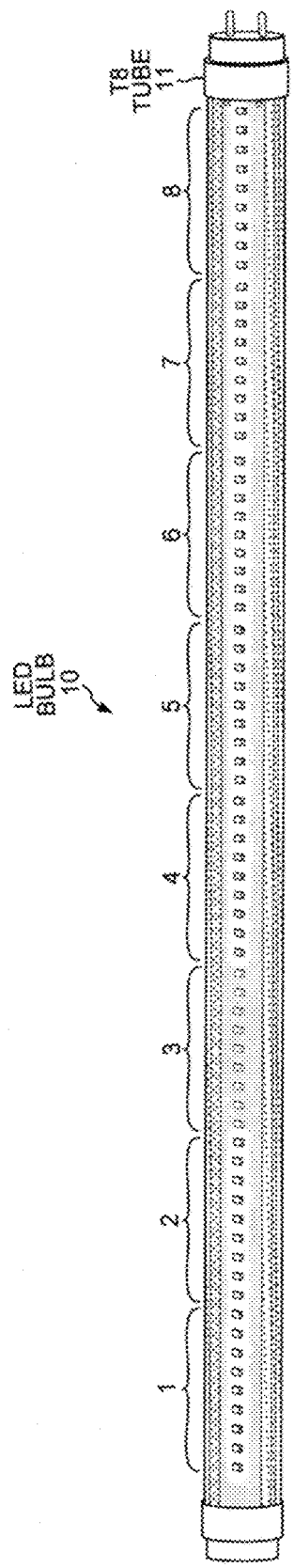
FIG. 1 (prior art) is an LED bulb formed by mounting LEDs onto a long substrate anchored in a tube that resembles a T8 fluorescent bulb.
Figure 2:
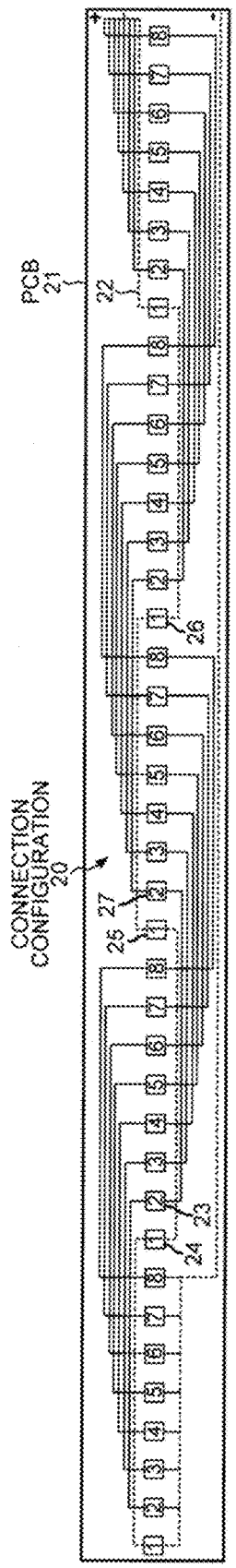
FIG. 2 is a diagram of a novel interleaved connection configuration for a linear lighting module that includes linear arrays of interleaved LEDs mounted onto a long PCB that can be placed in a tube.

FIG. 2 shows a novel interleaved connection configuration 20 for a linear lighting module that includes a linear array of light emitting diode (LED) dies mounted onto a long printed circuit board 21 that can be placed in a tube. The interleaved connection configuration 20 is particularly advantageous for use in LED bulbs in which the linear array of LEDs is placed in a tube that resembles a T5, T8 or T12 fluorescent bulb. For example, configuration 20 could be used in a 4-foot T8 bulb. For illustration purposes, FIG. 2 shows a connection configuration limited to eight series-connected strings of five LEDs each. Other embodiments of the connection configuration 20, however, have different numbers of LEDs. For example, a 4-foot T8 bulb would typically have more LEDs, such as seventy-two or eighty-eight, which would be configured as eight strings of nine LEDs or eight strings of eleven LEDs, respectively. In addition, the interleaved connection configuration 20 of the forty LEDs shown in FIG. 2 could alternatively be implemented as four strings of ten LEDs.

All forty of the interleaved LED dies shown in FIG. 2 are aligned with respect to one another. Although the LED dies are arranged in a straight line in FIG. 2, the line of LEDs could also be curved in other embodiments. For example, the line of LED dies could curve in the xy dimension of FIG. 2 if the LEDs were used in a U-shaped tube. Alternatively, the line of LEDs would curve in the z dimension (out of the page of FIG. 2) if the LEDs were mounted onto a flexible PCB strip that is rolled. Thus, the aligned LED dies in configuration 20 need not be configured in a straight line.

The LED dies of each of the series-connected strings shown in FIG. 2 are interleaved among the LED dies of the other series-connected strings. For example, the LED dies of a first string are interleaved among the LED dies of a second string in FIG. 2. The five LED dies of the first string are labeled "1" and are electrically connected by the conductor 22 indicated by the dashed line. The LED dies of the second string are labeled "2". The first string of LED dies is coupled in parallel with the second string of LED dies because the input nodes of both strings are coupled to the power input terminal "+", and the output nodes of both strings are coupled to the ground output terminal "−". An LED die of the second string is disposed between every successive pair of LED dies along the first string. For example, the LED die 23 of the second string is disposed between the second successive pair of LED dies 24-25 of the first string, and the LED die 27 of the second string is disposed between the third successive pair of LED dies 25-26 of the first string.

Figure 3:
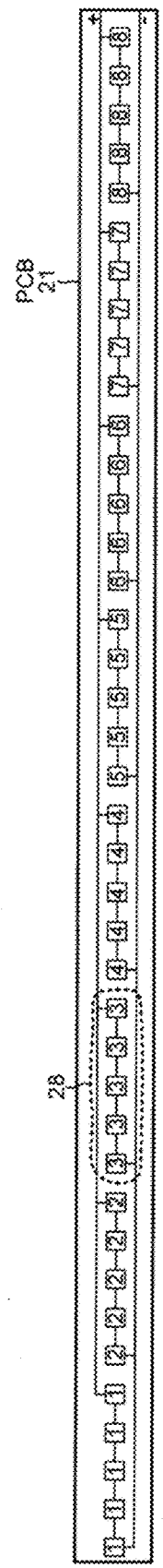
FIG. 3 shows a configuration of series-connected strings of LEDs that are coupled in parallel but that are not interleaved among one another.

FIG. 3 shows a configuration of eight strings of five LEDs in which the LEDs of the strings are not interleaved among one another. For example, all of the LEDs of the third string 28 are arranged adjacent to one another. If one of the LEDs in the string 28 is defective or burns out or if a solder connection in the string 28 shorts out, then none of the five LEDs in the third string 28 can be illuminated. A consumer of an LED bulb with the connection configuration of FIG. 3 would surely notice the dark portion of the bulb potentially caused by a single defective LED and would likely return the bulb. However, the same defect in a bulb with the connection configuration 20 of FIG. 2 would not result in a dark portion of the bulb.

Figure 4:
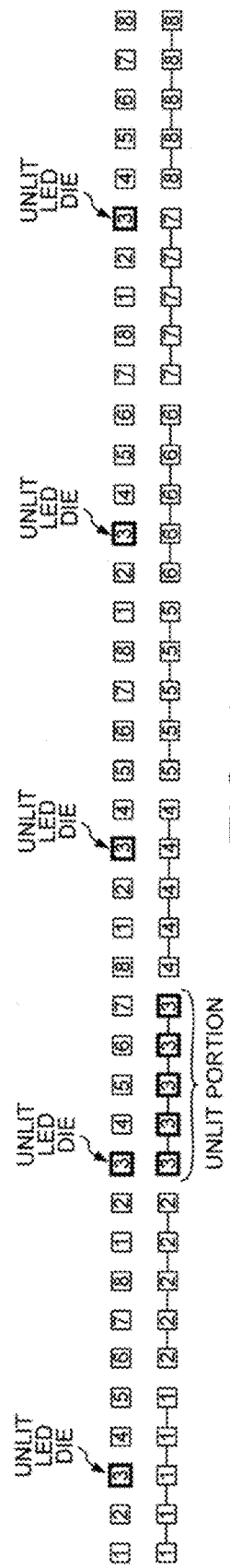
FIG. 4 is a diagram that compares the locations of the unlit LEDs in the connection configurations of FIGS. 2 and 3 that would result from a defect somewhere along a series-connected string.

FIG. 4 compares the locations of the dark LEDs in the connection configurations of FIGS. 2 and 3 that would result from a defect somewhere along the third string. The upper row of LEDs in FIG. 4 illustrates the positions of the series-connected LED dies of the third string that would remain unlit in the connection configuration 20 of FIG. 2 with a short in the third string. Each unlit LED die has a thicker border. The lower row in FIG. 4 illustrates the positions of the LED dies of the third string that would remain unlit in the connection configuration of FIG. 3 with a short in the third string. Although a consumer would surely notice a dark portion equaling one eighth of the length of the bulb as shown in the lower row, the consumer would probably not notice the dark LED dies of the third string in the upper row that are interspersed among the lit LED dies of the other strings. In addition, where the LED bulb has a diffusing milky cover as opposed to a transparent glass cover, the individual dark LED dies are more difficult to distinguish. Finally, the lit LED dies would be brighter and would compensate for much of the lost light output of the LED dies in the third string.

The LED drive current is divided between the various strings based on the total voltage drop across the series-connected LED dies of each string. A typical blue LED has a forward voltage of about 3.3 volts, which can vary by as much as a 20%. The variation in the total voltage drop across the strings causes an imbalance between the drive currents that flow through the various strings. Fortunately, the differences in the forward voltages of multiple LED dies tend to cancel each other out. The probability that the LED dies in one string will all have either a higher or a lower forward voltage than 3.3 volts decreases as more LED dies are added to each string. For example, the total voltage drop across multiple strings of eleven LED dies does not vary significantly.

However, if an LED die in a series-connected string fails open, then no LED drive current will flow through that string, and the current that would have flowed through the shorted string is diverted to the remaining strings. The current in each of the other strings will increase by a factor of $1/(S-1)$, where S is the total number of strings. Thus, if there is a short in the third string of LED dies in FIG. 2, then the LED drive current will increase by one seventh in each of the other strings as the drive current from the third string is diverted evenly to the other strings.

Except when an LED is "overdriven" by high drive currents, the light output from the LED varies nearly proportionally to the drive current. So the light output of the LEDs in each of the remaining powered strings in FIG. 4 will increase by almost one seventh, and the total light output by the remaining thirty-five LEDs that are lit will be almost as great as the light output by the same drive current flowing through all forty LEDs. A consumer who does not notice any dark spots from individual dispersed unlit LEDs in the third string will probably not perceive any reduced light output from the LED bulb and will not return the bulb for being defective. At larger LED drive currents, however, an incremental increase in the drive current results in an ever smaller proportionate increase in the luminous flux output by the LED die. Moreover, the operating lifetime of an LED die is significantly reduced when the LED die is overdriven. Thus, it is advantageous to use many series-connected strings S so that the proportionate increase in the LED drive current by $1/(S-1)$ that results when one string shorts out is small and does not results in the remaining LED dies being overdriven. For example, when one of eight strings shorts out, the current through the remaining strings increases by less than 15%, which is usually not sufficient to overdrive the remaining LED dies. Connecting the LED dies of each series-connected string in an interleaved combined string, however, becomes more complicated as each successive string is added to the combined string.

Figure 5:
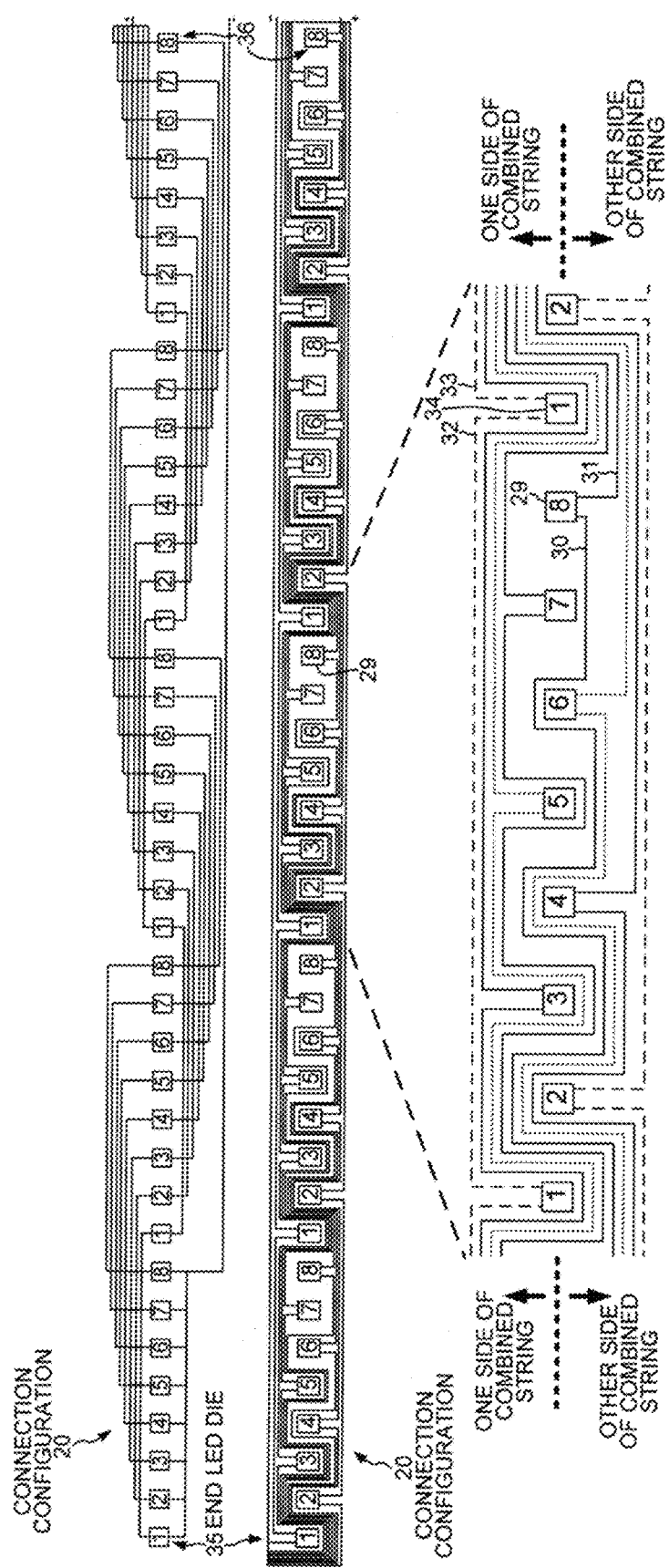
FIG. 5 is a diagram showing two alternative methods of wiring LED dies with the interleaved connection configuration of FIG. 2.

FIG. 5 shows two alternative methods of wiring the forty LED dies that have the interleaved connection configuration 20 of FIG. 2. The top wiring arrangement in FIG. 5 is the method used to connect the LED dies on the printed circuit board 21 of FIG. 2. The bottom wiring arrangement in FIG. 5 is a novel way to connect the forty LED dies using a single conductive layer that precludes the crossing of any conductors.

The top wiring arrangement in FIG. 5 connects the LED dies using conductors that cross each other multiple times. For example, the conductor that connects two LED dies of a series-connected string must cross the seven conductors that connect the LED dies of each of the other seven strings. This wiring arrangement cannot be implemented on a single conductor PCB, but would most easily be realized on a printed circuit board with eight conductive layers. The conductors would cross over each other using vias that connect the various conductive layers of the PCB. Implementing the connection configuration 20 on a printed circuit board having a single conductive layer, however, has two advantages. First, a PCB with a single metal layer is less expensive to produce than a PCB with multiple metal layers. Second, a printed circuit board with a single conductive layer is thinner than a multi-layer board and therefore can be made more flexible. In the manufacturing process of making LED bulbs, it is desirable to source the LED dies from rolls of flexible strips of printed circuit board with pre-mounted and wired LED dies. The appropriate length of the combined and interleaved LED strings can then be unrolled, cut and attached to a flat surface in the LED bulb. Segments from rolls of pre-mounted LED dies can be inserted into different kinds of housings to make various models of LED bulbs. Therefore, a method is sought that allows multiple strings of interleaved LED dies to be connected using a flexible, single-layer printed circuit board.

The bottom wiring arrangement in FIG. 5 illustrates a method for using a single-layer conductor to connect the interleaved LED dies of each of the eight series-connected strings of five LED dies. The wiring arrangement can be seen in more detail in the expanded portion of the bottom wiring arrangement showing the conductors connected to ten successive LED dies along the combined string. No conductor in the bottom wiring arrangement crosses any other conductor. Each LED die of the combined string of forty LED dies is electrically connected to two conductors. For example, the LED die 29 of the eighth string is connected to the two conductors 30-31, as shown in the expanded portion of the bottom wiring arrangement. Each successive LED die along the combined string is accessed by both conductors from alternating sides of the combined string. For example, both conductors 32-33 access LED die 34 of the first series-connected string from one side of the combined string, while both conductors 30-31 access the adjacent LED die 29 of the eighth string from the other side of the combined string.

Note that the bottom wiring arrangement can connect all of the LED dies in the combined string using a single conductive layer even if the two end LED dies 35-36 of the combined string are not reached by both conductors from the opposite side of the combined string from which the adjacent LED dies are reached. Nevertheless, the two end LED dies 35-36 in the bottom wiring arrangement of FIG. 5 are accessed by both conductors from the opposite side of the combined string from which the adjacent LED dies are accessed.

The LED drive current to each of the LED dies is received through one of the conductors and passes towards the ground terminal through the other conductor. For example, LED die 29 of the eighth string is connected to a power supply conductor 31 and to a conductor 30 that passes the current towards ground. Each successive LED die along the combined string is electrically connected to a power supply conductor that connects to the die from an alternating side of the combined string. For example, the power supply conductor 33 connects to the LED die 34 of the first series-connected string from one side of the combined string, while the power supply conductor 31 connects to the adjacent LED die 29 of the eighth string from the other side of the combined string.

Figure 6:
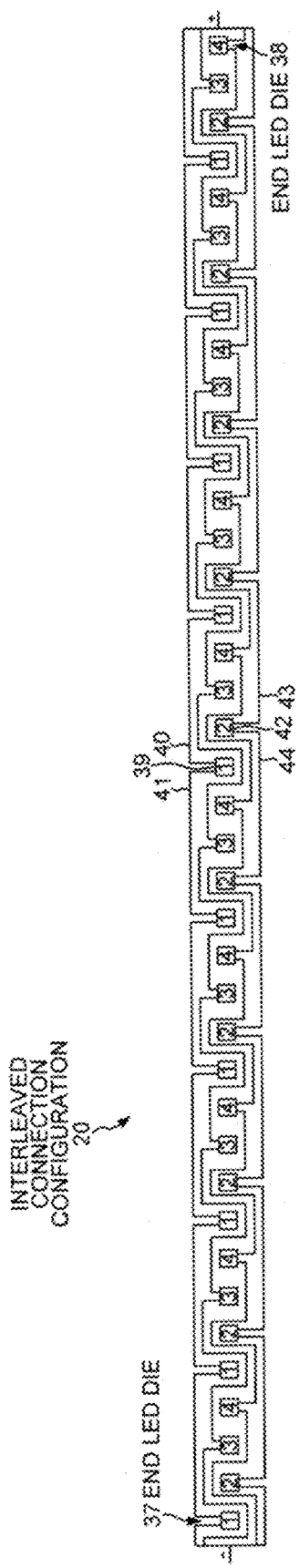
FIG. 6 illustrates a non-crossing wiring arrangement that connects interleaved LED dies of four series-connected strings of ten LED dies each.

FIG. 6 illustrates another embodiment of the non-crossing wiring arrangement that connects interleaved LED dies of four series-connected strings of ten LED dies each. FIG. 6 shows a first linear array of ten LED dies labeled with is connected in series and a second linear array of ten LED dies labeled with 2s connected in series. There are also third and fourth linear arrays in the combined string of interleaved LED dies. The first and second linear arrays are coupled in parallel and are collinear. The LED dies of the first linear array are interleaved between the LED dies of the second linear array. No two LED dies of the first linear array are immediately adjacent to one another without an intervening LED die of the second linear array. For example, an LED die of the second string labeled with a "2" is disposed between each successive pair of LED dies of the first string labeled with 1s. Each LED die is connected to a first conductor that is coupled to the power input terminal "+" and to a second conductor that is coupled to the ground terminal "−". Except for at the ends of the strings, the conductors are coupled to power and to ground through the other LED dies of each series-connected string. And except for the end LED dies 37-38 of the combined string, each successive LED die is accessed by both the power and ground conductors from alternating sides of the combined string. Thus, the power supply conductor to each successive LED die connects from an alternating side of the combined string. For example, the LED die 39 of the first linear array is connected to both a power conductor 40 and a ground conductor 41 from one side of the combined string, while the next LED die 42 along the combined string, which belongs to the second linear array, is connected to both a power conductor 43 and a ground conductor 44 from the other side of the combined string.

Figure 7:
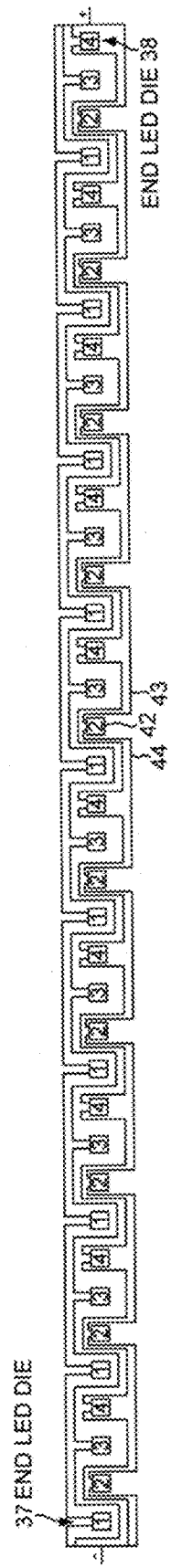
FIG. 7 shows the non-crossing wiring arrangement of FIG. 6 modified so that the landing pads to which the wire bonds connect to the LED dies are all on the same side of the combined string.

FIG. 7 shows another embodiment of a non-crossing wiring arrangement that connects interleaved LED dies of four series-connected strings of ten LED dies each. The wiring arrangement of FIG. 7 differs from that of FIG. 6 in that the landing pads to which the wire bonds connect to the forty LED dies in FIG. 7 are all on the same side of the LED dies. In FIG. 6, the wire bonds to each successive LED die connect to landing pads on alternating sides of the LED dies. Nevertheless, except for the end LED dies 37-38 of the combined string, each successive LED die in FIG. 7 is still accessed by both the power and ground conductors from alternating sides of the combined string despite the fact that the conductors contact all of the LED dies on the same side. The conductors access an LED die from the side from which the conductors emerge to wrap around the adjacent LED dies. For example, LED die 42 of the second linear array is attached to both the power conductor 43 and the ground conductor 44 on the upper side in FIG. 7, but LED die 42 is nevertheless accessed from and connected to both conductors 43-44 from the lower side of the combined string in FIG. 7. The power conductor 43 passes around the adjacent LED die of the third linear array from the lower side, and the ground conductor 44 passes around the adjacent LED die 39 of the first linear array from the lower side. In an alternative embodiment, the LED dies are not connected to the conductors by wire bonds. Rather, the LED dies are flip chip mounted and contact the ends of the conductors directly.

Figure 8:
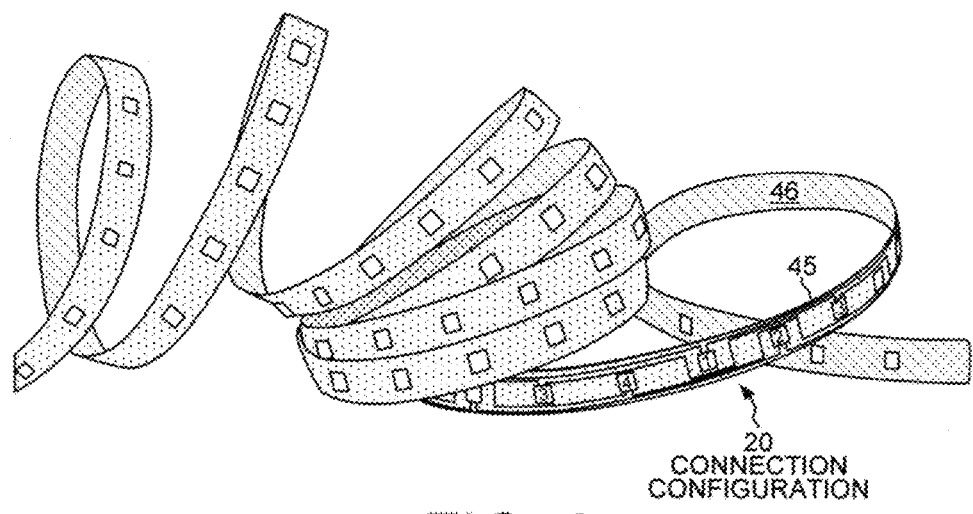
FIG. 8 shows a rolled strip of flexible PCB to which LED dies have been mounted and wired using the interleaved connection configuration of FIG. 2 and the non-crossing wiring arrangement of FIG. 6.

FIG. 8 shows an unraveling roll 45 of LED dies wired and mounted to a strip of flexible printed circuit board 46. The LED dies on the roll of flexible PCB 46 are connected using the interleaved connection configuration 20 of FIG. 2. In addition, the interleaved LED dies are wired using the non-crossing wiring arrangement of FIG. 6. The conductors that electrically connect the LED dies to each other and to power and ground are formed from a single conductive layer of the flexible PCB 46. Some of the LED dies on the roll 45 of FIG. 8 have been labeled to indicate that they belong to one of four series-connected strings of ten LED dies each. An LED bulb can be manufactured using a length of the strip of mounted LED dies. For example, a strip of the flexible PCB 46 somewhat less than four feet long can be attached with thermal glue to an aluminum substrate that fits inside a tube in order to make a 4-foot T8 LED bulb. To simplify the drawings, the non-crossing wiring arrangement of FIG. 6 is illustrated with four series-connected strings of ten LED dies each. However, an LED bulb would just as likely have more total LEDs. For example, a more likely configuration would be eight strings of eleven LEDs.

FIG. 9 shows a 4-foot T8 LED bulb 47 that has eighty-eight LED dies configured as eight series-connected strings of eleven LEDs each. The LED dies of the eight strings are interleaved according to the connection configuration 20 of FIG. 2 and are wired using the non-crossing wiring arrangement of FIG. 5. Each string of eleven LED dies has a total voltage drop of about 37.4 volts where the gallium-nitride LED dies have an average individual band gap of 3.4 volts. The eight strings are driven by a buck converter that converts the 120-volt alternating wall current to a direct current with about 40 volts. The LED driver is, however, a constant current driver as opposed to a constant voltage driver. FIG. 9 illustrates the case in which an LED die of the third series-connected string of eleven dies 48-58 has shorted out so that all of the dies in the string are dark. Because the series-connected strings of LED dies have been interleaved, the eleven unlit LED dies 48-58 are hardly noticeable. When current no longer flows through the shorted third string, the current flowing through each of the other seven strings increases by one seventh so that the light output by the remaining seventy-seven LED dies increases by almost one seventh to compensate for the lost light output from the third string.

FIG. 10 shows an end of the LED bulb 47 of FIG. 9 in more detail. The tube of bulb 47 is made in two sections. A top section 59 of the tube slides into grooves in the bottom section 60. In this embodiment, the top section 59 is translucent plastic that diffuses the light emitted from the LED dies. No black spots are apparent in the light that shines through the top section 59 of the tube even when a shorted string of LED dies is not lit. In this embodiment, the bottom section 60 of the tube is made of extruded aluminum. The bottom section 60 has a curved portion and a flat portion.

The flat portion has the grooves into which the top section 59 snaps or slides. The strip of the flexible PCB 46 with mounted and wired LED dies is attached to the flat portion. FIG. 10 shows that the LED dies on the strip are connected by a single layer of non-crossing interconnect tracks on the flexible substrate 46.

In this embodiment, the LED dies are chip scale packaged LED dies in which the semiconductor die is mounted directly to the substrate 46 without any additional intervening substrate. For example, each LED die is a volumetric white chip in which silicone with embedded phosphor particles conforms directly to the chip. This allows the size of the individual LED dies to be smaller, which leaves more room for the interconnect tracks. In this case, the LED dies are rectangular with no side longer than 1.8 mm. With S strings of series-connected LED dies, S-2 interconnect tracks must fit between the adjacent LED dies of the first and second strings. Thus, six interconnect tracks must fit between the first and second and between the ninth and tenth LED dies shown on the flexible substrate 46 of FIG. 10. The smaller chip scale packaged LED dies allow a large number of dies to be mounted in the LED tube with sufficient distance remaining between the dies to accommodate the non-crossing wiring arrangement of FIG. 5.

Figure 11:
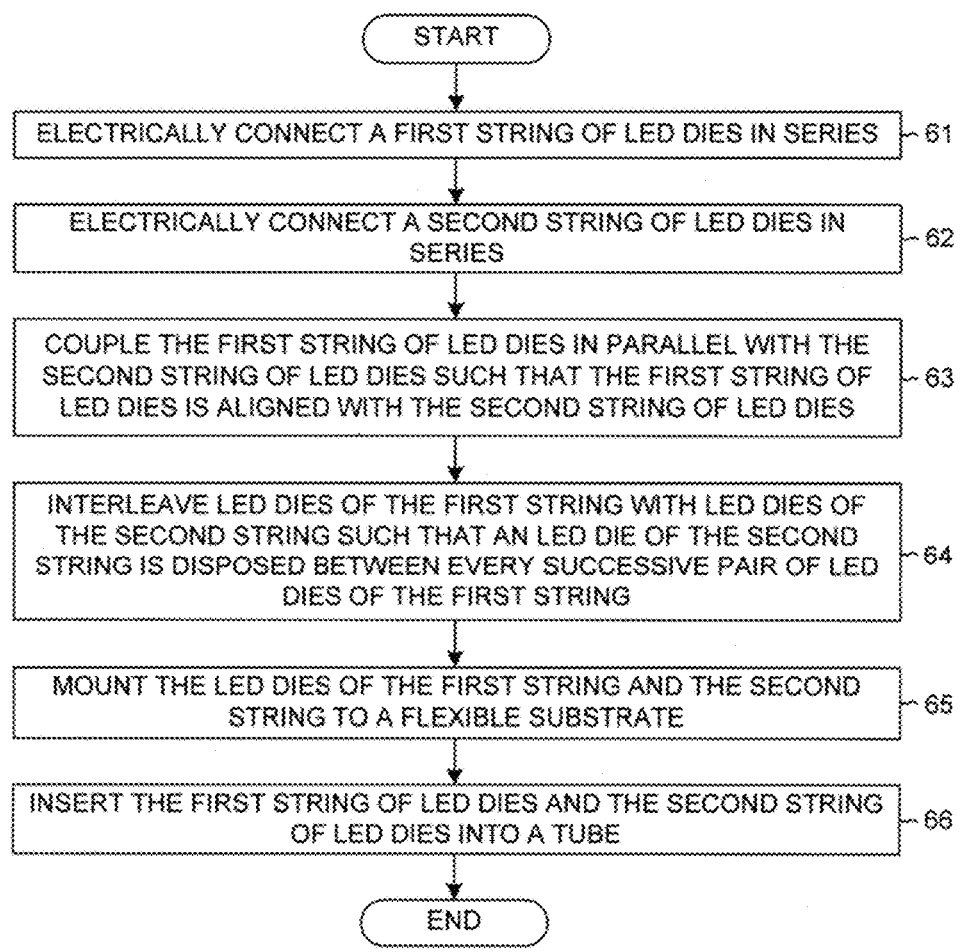
FIG. 11 is a flowchart of steps for making LED bulb of FIG. 9.

FIG. 11 is a flowchart illustrating steps 61-66 of a method of making the LED bulb 47 that has series-connected strings of LED dies wired using the non-crossing wiring arrangement of FIG. 5 and interleaved according to the connection configuration of FIG. 2. In a first step 61, a first string of LED dies is electrically connected in series. For example, a first string of eleven LED dies mounted on flexible substrate 46 is connected in series by interconnect tracks etched in the top metal layer of the flexible PCB. In step 62, a second string of LED dies is electrically connected in series on the substrate 46. In step 63, the first string of LED dies is coupled in parallel with the second string of LED dies such that the first string of LED dies is aligned with the second string of LED dies. The LED dies are aligned one behind the other along the flexible PCB strip. The LED dies need not be aligned in a straight line. For example, the line of LED dies curves when the flexible PCB strip is wound in a roll 45. The series-connected strings are coupled in parallel by connecting the ends of the strings to the same power and ground terminals.

In step 64, the LED dies of the first string are interleaved with the LED dies of the second string such that an LED die of the second string is disposed between every successive pair of LED dies of the first string. In addition, as is apparent from FIG. 5, every successive pair of LED dies of every string is separated by an LED die of each remaining string. For example, between every two closest LED dies of the second string lies an LED die of each of strings 1, 3, 4, 5, 6, 7 and 8. In order to use the interconnect tracks of a single conductive layer of flexible PCB 46 to connect the strings in series in steps 61-62, to couple the strings in parallel in step 63, and to interleave the LED dies of the various strings in step 64, each successive LED die along the combined string (except for the end LED dies) must be accessed by the interconnect tracks from alternating sides of the combined string. Thus, the interconnect track that supplies LED drive current to each successive LED die wraps around the adjacent LED die from an alternating side of the combined string.

In step 65, the LED dies of the first string and the second string are mounted to the flexible substrate 46. Although the LED dies could be connected and wired, for example, partly through wire bonds, after the dies are mounted to the substrate, it is also possible to form the electrical connections entirely as interconnect tracks on the substrate 46 before the LED dies or chip-scale-packaged LED dies are flip-chip mounted onto the pre-wired substrate. Thus, in one embodiment of the method of FIG. 11, the positions of the LED dies are series-connected in strings in steps 61-62, the strings of the LED positions are coupled in parallel in step 63, and the positions of the LED dies in the various strings are interleaved in step 64 all before the actual physical LED dies are mounted onto the substrate 46.

In step 66, the first string of LED dies and the second string of LED dies are inserted into a tube 59-60. The flexible PCB strip with mounted and wired LED dies is attached with an adhesive to a flat metal surface. In one implementation, the flat metal surface is the flat portion of the bottom section 60 of a tube that also has a curved portion. The top section 59 of the tube is a transparent or translucent cover that attaches to the bottom section 60 to form a cylindrical bulb. In another implementation, the long, flat piece of metal to which the flexible PCB strip with mounted and wired LED dies has been attached is inserted into a cylindrical glass or plastic tube. The power and ground terminals of the LED strip are then connected to the LED driver, which in turn is connected to the end plugs of the LED bulb, which fit into the sockets of the troffer.

Although certain specific embodiments are described above for instructional purposes, the teachings of this patent document have general applicability and are not limited to the specific embodiments described above. Accordingly, various modifications, adaptations, and combinations of various features of the described embodiments can be practiced without departing from the scope of the invention as set forth in the claims.

What is claimed is:

1. A device comprising:
   a first string of series-connected light emitting diode (LED) dies; and
   a second string of series-connected LED dies, wherein there are S strings of series-connected LED dies, wherein S is greater than or equal to eight, wherein the first string of LED dies is coupled in parallel with the second string of LED dies, wherein all of the LED dies of the first string and the second string are aligned with respect to one another, wherein an LED die of the second string is disposed between every successive pair of LED dies of the first string, wherein each of the LED dies is electrically connected to two conductors, and wherein S-2 conductors pass between at least two adjacent LED dies.

2. The device of claim 1, wherein all of the LED dies of the first string of LED dies are arranged along a straight line, and wherein all of the LED dies of the second string of LED dies are arranged along the straight line.

3. The device of claim 1, wherein the LED dies of the first string and the second string form a combined string of interleaved LED dies, and wherein except for the two end LED dies each successive LED die is accessed by both conductors from alternating sides of the combined string.

4. The device of claim 1, wherein the LED dies of the first string and the second string form a combined string of interleaved LED dies, wherein each LED die of the combined string is electrically connected to a power supply conductor, and wherein except for the end LED dies of the combined string, the power supply conductor to each successive LED die connects from an alternating side of the combined string.

5. The device of claim 1, wherein the LED dies of the first string and the second string are mounted on a flexible substrate.

6. The device of claim 1, wherein the first string of LED dies and the second string of LED dies are disposed in a tube.

7. The device of claim 1, further comprising:
a flexible substrate with a metal layer, wherein interconnect tracks are formed in the metal layer, wherein the conductors that electrically connect the LED dies of the first string are formed by a first group of interconnect tracks, wherein the conductors that electrically connect the LED dies of the second string are formed by a second group of interconnect tracks, and wherein none of the first group of interconnect tracks crosses any of the second group of interconnect tracks.

8. The device of claim 1, wherein the LED dies are chip scale packaged LED dies.

9. The device of claim 1, wherein the LED dies are rectangular with no side longer than 1.8 mm.

10. The device of claim 1, wherein the LED dies are chip scale packaged LED dies whose sides are not longer than 1.8 mm.

11. The device of claim 1, wherein no conductor crosses any other conductor.

12. A device comprising:
a first linear array of light emitting diode (LED) dies connected in series;
a second linear array of LED dies connected in series, wherein the first linear array of LED dies is coupled in parallel with the second linear array of LED dies, wherein all of the LED dies of both the first linear array of LED dies and the second linear array of LED dies are collinear, and wherein the LED dies of the first linear array are interleaved between the LED dies of the second linear array; and
an Nth linear array of LED dies connected in series, wherein N is eight or greater, and wherein each of the LED dies of each of the N arrays of LED dies is electrically connected to two conductors, and wherein N-2 conductors pass between at least two adjacent LED dies.

13. The device of claim 12, wherein none of the conductors crosses any other of the conductors.

14. The device of claim 12, wherein the LED dies of the first linear array and the second linear array are mounted on a flexible substrate.

15. The device of claim 12, wherein the first linear array of LED dies and the second linear array of LED dies are disposed in a tube.

* * * * *